United States Patent [19]

Thomas et al.

[11] Patent Number: 4,680,086
[45] Date of Patent: Jul. 14, 1987

[54] DRY ETCHING OF MULTI-LAYER STRUCTURES

[75] Inventors: Patrick K. Thomas, Pflugerville; Dennis C. Hartman, Austin; Jasper W. Dockrey, Pflugerville, all of Tex.

[73] Assignee: Motorola, Inc., Schaumburg, Ill.

[21] Appl. No.: 841,976

[22] Filed: Mar. 20, 1986

[51] Int. Cl.$^4$ ............... H01L 21/306; H01L 21/308
[52] U.S. Cl. ................... 156/643; 156/646; 156/653
[58] Field of Search ........... 156/653, 652, 646, 345, 156/643, 662; 204/192 E, 298, 192.32, 192.34, 192.35, 192.37

[56] References Cited

U.S. PATENT DOCUMENTS

| | | | |
|---|---|---|---|
| 4,253,907 | 3/1981 | Parry et al. | 156/646 |
| 4,414,057 | 11/1983 | Bourassa et al. | 156/643 |
| 4,464,223 | 8/1984 | Gorin | 156/345 |
| 4,563,240 | 1/1986 | Shibata et al. | 156/646 |

Primary Examiner—Kenneth M. Schor
Attorney, Agent, or Firm—John A. Fisher; Jeffrey Van Myers; Jonathan P. Meyer

[57] ABSTRACT

A method for etching multi-layer structures particularly suited for patterning refractory metal silicide/polysilicon sandwiches. A first dry etch process is carried out in a first dry etch chamber and is selected to rapidly and anisotropically etch the uppermost layer, typically a refractory metal silicide. A second dry etch process is carried out in a second etch chamber and is selected to rapidly and anisotropically etch the underlying layer, typically polysilicon, while having a high selectivity to any material underlying the underlying layer. The first process is preferably a fluorine-chemistry process with low frequency RF energy and the substrate resting on the grounded electrode. The second process is preferably a chlorine-chemistry process with high frequency RF energy and the substrate resting on the powered electrode.

6 Claims, 4 Drawing Figures

DRY ETCHING OF MULTI-LAYER STRUCTURES

FIELD OF THE INVENTION

The present invention relates, in general, to the dry etching of multi-layer structures. More particularly, the invention relates to a method useful for dry etching refractory metal silicide/polysilicon structures in the manufacture, for instance, of semiconductor integrated circuits.

BACKGROUND OF THE INVENTION

Dry etching, as that term is used in the semiconductor industry, encompasses a number of related processes. The common feature of these processes is the presence of a gas or plasma which contains at least one reactive specie and which is energized by the application of RF energy. The gas or plasma is placed in contact with the structure being etched, a reaction takes place at the surface of the material and reacted material is removed in gaseous form.

The various distinct dry etching processes include reactive ion etching (RIE) and plasma etching. While the precise definition of these terms is not completely settled, the different processes are typically characterized by the pressure of the gas or plasma, the frequency of the RF energy supplied thereto, the configuration of the chamber in which the reaction takes place, the method of applying the RF energy to the gas or plasma and the chemistry of the gas or plasma. The generic term dry etching will be used throughout to refer to all of these related processes.

A structure which is of increasing interest in the field of integrated circuit manufacturing comprises a two layer "sandwich" of polysilicon underlying a refractory metal silicide. Such a structure typically overlies a thin layer of silicon dioxide dielectric, for example, and comprises the gate of an insulated-gate field effect transistor (IGFET) device. It has been found that such a structure is quite difficult to etch using dry etching techniques because of the differences in the response of the silicide and polysilicon materials to the etching processes.

For small geometry devices, it is necessary to carefully control the edge profile of the structure being etched. In addition, since the underlying dielectric is often quite thin, a process with a very high selectivity to silicon dioxide is required. Despite numerous attempts, the prior art does not disclose a dry etching process which can effectively etch a silicide/polysilicon structure with good edge profile control and high selectivity to an underlying dielectric.

SUMMARY OF THE INVENTION

Accordingly, it is an object of the present invention to provide a method for dry etching of multi-layer structures which provides adequate edge profile control and high selectivity to underlying layers.

It is a further object of the present invention to provide a method for dry etching of refractory metal silicide/polysilicon structures which provides adequate edge profile control and high selectivity to underlying dielectric layers.

These and other objects and advantages of the present invention are provided by a dry etching process of two stages which is carried out in a two chamber dry etching apparatus. A first stage, which proceeds in a first chamber, comprises a low frequency, fluorine chemistry etch in which the lower electrode of the chamber is grounded. This etch removes unmasked portions of the silicide layer and also etches the upper portions of the polysilicon layer. The edge profile is basically that of an anisotropic etch. A second stage, which is carried out in a second chamber, comprises a high frequency, chlorine chemistry etch in which the RF power is applied to the lower electrode. This process removes the remaining polysilicon rapidly and anisotropically, without significant undercutting, and has a very high selectivity to the underlying silicon dioxide.

These and other objects and advantages of the present invention will be apparent to one skilled in the art from the detailed description below taken together with the drawings.

DETAILED DESCRIPTION OF THE INVENTION

Figure 1:
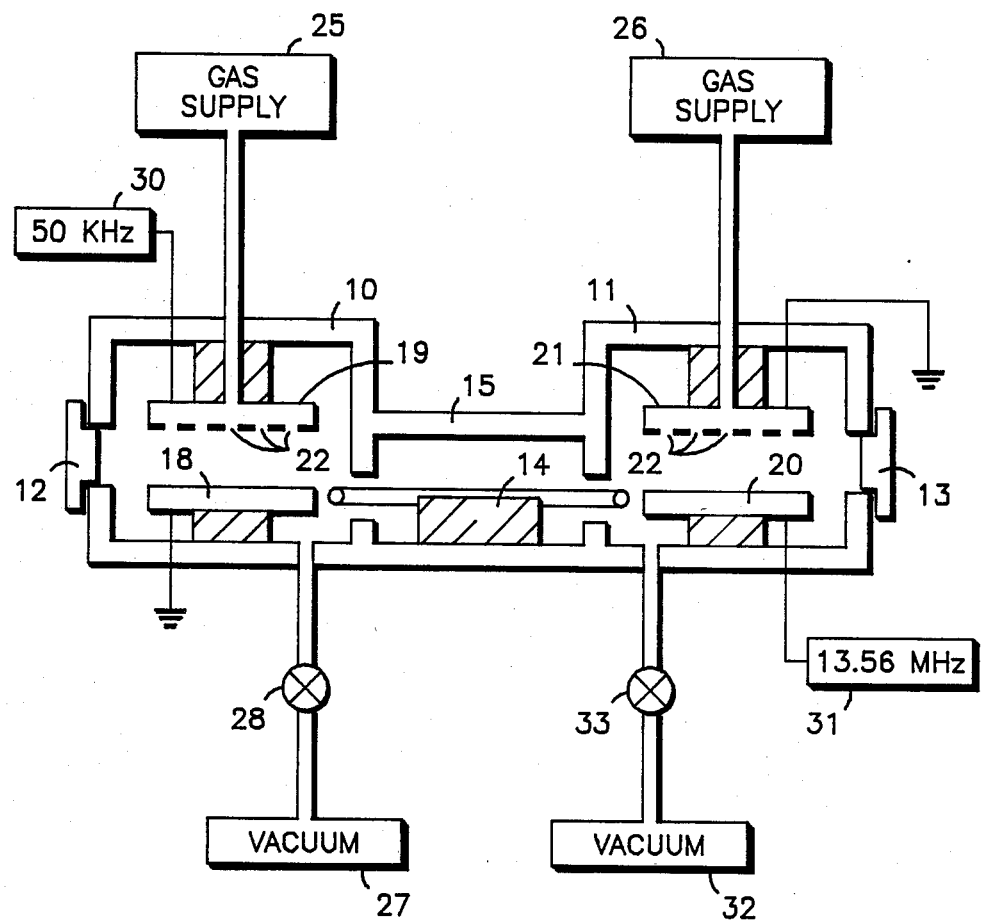
FIG. 1 is a simplified cross-sectional view of an apparatus suitable for practicing the present invention.

FIG. 1 is a simplified cross-sectional view of a multi-chamber dry etching apparatus which is suitable for use in practicing the present invention. A similar commercial etcher, although having three chambers instead of two, is available from the Zylin Corporation. The apparatus comprises a first etch chamber 10 and a second etch chamber 11. Wafers to be etched are loaded into first chamber 10 by means of an access door 12. Etched wafers are removed from second chamber 11 by means of an access door 13. Wafers are transported from first chamber 10 to second chamber 11 by means of a wafer transport 14 which carries the wafers through a passage 15 which joins first chamber 10 to second chamber 11.

Inside first chamber 10 are a lower electrode 18 and an upper electrode 19. Electrodes 18 and 19 have generally planar surfaces and are parallel to one another. Both upper electrode 19 and lower electrode 18 are electrically isolated from the walls of chamber 10. Similarly, a lower electrode 20 and an upper electrode 21 are within second chamber 11, have generally planar, parallel surfaces and are electrically isolated from the walls of chamber 11. As is familiar, lower electrodes 18 and 20 are adapted to hold a wafer during the etching process. Upper electrodes 19 and 21 are of the "shower head" type. That is, both are adapted to dispense the reactive gases into the space between the two electrodes by means of a plurality of openings 22 in their lower surfaces.

A first gas supply and flow control apparatus 25 is coupled to upper electrode 19 in order to supply a controlled flow of the chosen process gases to first chamber 10. Similarly, a second gas supply and flow control apparatus 26 is coupled to upper electrode 21 in order to supply a controlled flow of the chosen process gases to second chamber 11. For purposes of the present invention, it is important that each chamber have a dedicated gas supply and flow control apparatus. Similarly, a first vacuum system 27 is coupled through a pressure control valve 28 to first chamber 10 to control the pressure therein and to remove reaction products therefrom. A second vacuum system 32 is coupled through a second pressure control valve 33 to second chamber 11 to control the pressure therein and to remove reaction products therefrom.

First chamber 10 is energized, in the preferred embodiment of the present invention, by means of a 50 KHz power supply 30 which is electrically coupled to upper electrode 19. Lower electrode 18 is preferably grounded. Second chamber 11 is energized, in the preferred embodiment, by means of a 13.56 MHz power supply 31 which is electrically coupled to lower electrode 20. Upper electrode 21 is preferably grounded.

In operation, a wafer is loaded into first chamber 10 via access door 12 and placed on lower electrode 18. Access door 12 is closed and vacuum system 27 removes the atmosphere from chamber 10 and and vacuum system 32 removes the atmosphere from chamber 11. Once the internal pressure is at a predetermined level, gas supply and flow control apparatus 25 and 50 KHz power supply 30 are activated and the first stage of the etching process commences. When an endpoint of the first stage is reached, which is determined either by time or other well known means, gas supply and flow control apparatus 25 and 50 KHz power supply 30 are de-activated, wafer transport 14 is operated to transfer the wafer from lower electrode 18 to lower electrode 20 and the second stage of the etch process is commenced. Gas supply and flow control apparatus 26 and 13.56 MHz power supply 31 are activated. When an endpoint is reached, these are deactivated, the internal pressure is equalized with external atmospheric pressure, and the wafer is removed from lower electrode 20 by means of access door 13.

In the preferred embodiment of the present invention, the first stage of the etch process is designed to rapidly and anisotropically etch a silicide material. Of particular interest are refractory metal silicide materials such as tungsten disilicide, titanium disilicide, molybdenum disilicide and tantalum disilicide. It is also possible to alter the first stage process slightly in order to optimally etch a refractory metal layer. In the preferred embodiment, the process gases supplied are tetrafluoromethane, $CF_4$, (at a flow rate of approximately 190 SCCM) and oxygen (at a flow rate of approximately 5 SCCM). The pressure maintained in chamber 10 is approximately 1 torr, the power supplied is approximately 80 watts, and the temperature is approximately 20 degrees C. The preferred electrode spacing is approximately 1 inch. For tungsten silicide, this process produces an etch rate of approximately 2500 angstroms per minute and a relatively anisotropic edge profile. End point detection is achieved simply by timing the reaction, since it is simply required that the silicide be cleared and some portion of the polysilicon be etched. In addition to $CF_4$, it is believed that $CFCl_3$, $CF_2Cl_2$, $CF_3Cl$, $NF_3$, $SF_6$, $C_2F_5Cl$ and $C_2F_6$ might be suitable for the first stage of the process.

The second stage process is, according to the preferred embodiment, optimized to rapidly and anisotropically etch the polysilicon without significant undercutting and with a high selectivity to the underlying dielectric, typically silicon dioxide. The process gases chosen are helium (flow rate approximately 466 SCCM), hydrogen chloride (flow rate approximately 143 SCCM) and hydrogen iodide (flow rate approximately 17 SCCM). The pressure in chamber 11 is maintained at approximately 1.75 Torr, the temperature is approximately 5 degrees C. and the power applied is approximately 200 watts. The preferred electrode spacing is approximately 0.5 inch. End point detection is by means of monitoring changes in the DC bias between the upper and lower electrode, as is familiar in the art. To ensure complete removal of the polysilicon, a 100% overetch is preferably used after the endpoint is detected. This process produces very good etch characteristics and has a selectivity to silicon dioxide of approximately 100:1. No observable undercut is apparent in photomicrographs of samples etched according to this process and the overall edge profile is substantially anisotropic. In addition to HCl, it is believed that $Cl_2$, $BCl_3$, $CCl_4$ and $SiCl_4$ might be suitable for the second stage of the process.

Figure 2A:
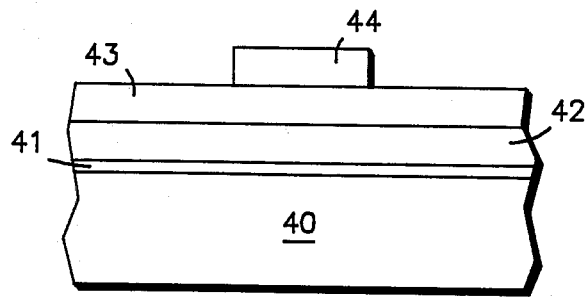
FIGS. 2A-2C are cross-sectional views illustrating various stages during etching according to the principles of the present invention.
Figure 2B:
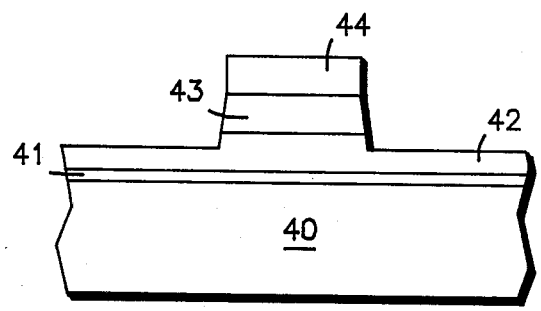
Figure 2C:
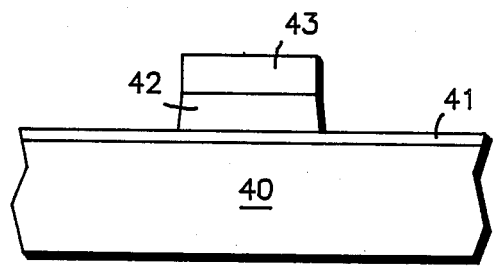

FIGS. 2A–2C more completely illustrate the various stages involved in the practice of the present invention. FIG. 2A illustrates a structure immediately prior to etching. An underlying substrate 40, such as a silicon wafer or the like, forms the base for the structure. Immediately overlying substrate 40 is a relatively thin dielectric layer 41. For instance, layer 41 may comprise a gate oxide layer of approximately 250 angstroms thickness. Overlying dielectric layer 41 is a polysilicon layer 42 which may comprise, for instance, a portion of a multi-level gate electrode structure. Polysilicon layer 42 is typically heavily doped for good conductivity and may be approximately 2500 angstroms thick. Overlying polysilicon layer 42 is a silicide layer 43 which may comprise, for instance, a tungsten disilicide layer forming a portion of a multi-layer gate electrode structure and having a thickness of approximately 2500 angstroms. Overlying silicide layer 43 is a patterned photoresist layer 44 which is used to create the pattern in the underlying layers.

Photoresist layer 44 may be any of a large number of well known photoresist materials whose properties and used are familiar. Photoresist layer 44 is preferably pre-treated with a 125 degree C. bake for approximately 30 minutes and exposed with deep UV for stabilization purposes.

FIG. 2B illustrates the structure after the first stage of the etch process. Except under patterned photoresist layer 44, all of silicide layer 43 has been removed in a substantially anisotropic fashion. In addition, the first stage etch has proceeded slightly into polysilicon layer 42. In the preferred embodiment, approximately 500 angstroms of polysilicon are removed.

FIG. 2C illustrates the structure after the final stages of the etch process. The second stage etch has carried the pattern down through the remainder of polysilicon layer 42 and stopped at dielectric layer 41. In addition, a subsequent resist strip operation has removed the patterned photoresist. The edge profile illustrated in FIG. 2C, substantially anisotropic throughout with no observable undercut, is consistent with actual photomicrographs of samples etched according to the detailed process description given above.

As will be apparent to one skilled in the art, the disclosed process provides an improved method for etching multiple layer structures and, particularly, an improved method for etching silicide/polysilicon structures for use in semiconductor integrated circuit manufacture. The two stage process provides rapid, anisotropic etching of the overlying silicide and also provides rapid, anisotropic etching of the underlying polysilicon with a high degree of selectivity to the underlying dielectric.

While the present invention has been described with reference to a preferred embodiment thereof, various modifications and changes thereto will be apparent to one skilled in the art and are within the spirit and scope of the present invention.

I claim:

1. A method for dry etching a multi-layer structure comprising a refractory metal silicide overlying a polysilicon material overlying a dielectric material comprising the steps of:

forming a patterned photoresist layer overlying said refractory metal silicide layer of said multi-layer structure to protect portions of said silicide layer;

supporting a substrate bearing said multi-layer structure on a grounded electrode in a first parallel plate-type dry etch chamber;

energizing a first reactive gas mixture comprising at least one fluorine-containing compound in said first dry etch chamber with energy of a first RF frequency coupled to a power electrode in said first chamber to completely remove unprotected portions of said refractory metal silicide;

transporting said substrate from said first dry etch chamber to a second parallel plate-type dry etch chamber after unprotected portions of said refractory metal silicide have been completely removed to expose portions of said polysilicon;

supporting said substrate on a powered electrode in said second parallel plate-type dry etch chamber;

energizing a second reactive gas mixture comprising at least one chlorine-containing compound in said second dry etch chamber with energy of a second RF frequency higher than said first RF frequency coupled to said powered electrode to completely remove unprotected portions of said polysilicon; and removing said substrate from said second dry etch chamber after exposed portions of said polysilicon have been completely removed wherein the lower energy of the first RF frequency and the support of the substrate on the grounded electrode are such that the silicide is etched rapidly and anisotropically, while the higher energy of the second RF frequency and the support of the substrate on the powered electrode are such that the polysilicon is eteched rapidly and anisotropically without substantially etching the dielectric material.

2. A method according to claim 1 wherein said first reactive gas mixture comprises tetrafluormethane and oxygen and said first frequency RF energy is at approximately 50 KHz.

3. A method according to claim 1 wherein said second reactive gas mixture comprises hydrogen chloride and hydrogen iodide and said second frequency RF energy is at approximately 13.56 MHz.

4. A method according to claim 2 wherein a pressure in said first dry etch chamber is maintained at approximately one Torr.

5. A method according to claim 3 wherein a pressure in said second dry etch chamber is maintained at approximately 1.75 Torr.

6. A method according to claim 1 wherein:

said first reactive gas mixture comprises tetrafluoromethane and oxygen at a pressure of approximately 1 Torr;

said first frequency is approximately 50 KHz;

said second reactive gas mixture comprises hydrogen chloride and hydrogen iodide at a pressure of approximately 1.75 Torr; and said second frequency is approximately 13.56 MHz.

* * * * *